(12) United States Patent
Chang et al.

(10) Patent No.: US 11,685,646 B2
(45) Date of Patent: Jun. 27, 2023

(54) SENSOR AND PACKAGE ASSEMBLY THEREOF

(71) Applicant: Robert Bosch GmbH, Stuttgart (DE)

(72) Inventors: Ken Chang, Taipei (TW); Wallace Chuang, Taipei (TW)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/295,212

(22) PCT Filed: Nov. 5, 2019

(86) PCT No.: PCT/EP2019/080147
§ 371 (c)(1),
(2) Date: May 19, 2021

(87) PCT Pub. No.: WO2020/108924
PCT Pub. Date: Jun. 4, 2020

(65) Prior Publication Data
US 2022/0002145 A1    Jan. 6, 2022

(30) Foreign Application Priority Data
Nov. 26, 2018 (CN) .......................... 201811417117.4

(51) Int. Cl.
*B81B 7/00* (2006.01)
(52) U.S. Cl.
CPC ...... *B81B 7/007* (2013.01); *B81B 2201/0264* (2013.01); *B81B 2207/012* (2013.01); *B81B 2207/07* (2013.01); *B81B 2207/096* (2013.01)
(58) Field of Classification Search
CPC ............ B81B 7/007; B81B 2201/0264; B81B 2207/012; B81B 2207/07; B81B 2207/096
(Continued)

(56) References Cited

U.S. PATENT DOCUMENTS

| 6,513,621 B1 * | 2/2003 | Deslauriers .......... H04R 1/1016 128/865 |
| 2007/0205492 A1 * | 9/2007 | Wang ................... B81C 1/0023 257/659 |

(Continued)

FOREIGN PATENT DOCUMENTS

| CN | 105621343 B | 5/2018 |
| TW | 201625022 A | 7/2016 |

(Continued)

OTHER PUBLICATIONS

International Search Report corresponding to PCT Application No. PCT/EP2019/080147, dated Mar. 6, 2020 (3 pages).

*Primary Examiner* — Hrayr A Sayadian
(74) *Attorney, Agent, or Firm* — Maginot, Moore & Beck LLP

(57) ABSTRACT

A sensor includes: a redistribution layer comprising a first face and a second face opposite to each other; a first die electrically connected to the first face of the redistribution layer; a molding compound comprising a third face and a fourth face opposite to each other, wherein the third face of the molding compound is combined with the first face of the redistribution layer, and the molding compound encapsulates the first die on the side of the first face of the redistribution layer; and a sensing element electrically connected to the redistribution layer. The package assembly of the sensor allows more elements to be packaged together, and provides a better structural support or provides a better heat distribution for the package assembly, and at the same time, reduces the volume and costs of the entire package assembly.

15 Claims, 2 Drawing Sheets

(58) Field of Classification Search
USPC .......................................................... 257/415
See application file for complete search history.

(56) References Cited

U.S. PATENT DOCUMENTS

| | | | |
|---|---|---|---|
| 2012/0266684 A1* | 10/2012 | Hooper | ................. B81B 7/0041 |
| | | | 73/715 |
| 2015/0298966 A1 | 10/2015 | Bowles et al. | |
| 2018/0134546 A1* | 5/2018 | Oh | ........................ H01L 23/315 |
| 2018/0146302 A1 | 5/2018 | Chen et al. | |

FOREIGN PATENT DOCUMENTS

| | | |
|---|---|---|
| TW | I571428 B | 2/2017 |
| TW | 201740515 A | 11/2017 |
| TW | 201829291 A | 8/2018 |

* cited by examiner

SENSOR AND PACKAGE ASSEMBLY THEREOF

This application is a 35 U.S.C. § 371 National Stage Application of PCT/EP2019/080147, filed on Nov. 5, 2019, which claims the benefit of priority to Serial No. CN 201811417117.4, filed on Nov. 26, 2018 in China, the disclosures of which are incorporated herein by reference in their entirety.

The present disclosure relates to sensor technologies, and in particular to a sensor based on micro electro-mechanical technology, and a package assembly thereof.

BACKGROUND

A micro electro-mechanical system (MEMS) sensor is a sensor manufactured by using microelectronic and micromechanical processing techniques. Compared with conventional sensors, the MEMS sensor is characterized by a small volume, a light weight, low costs, low power consumption and high reliability, and is suitable for mass production and it is easy to integrate said sensor and achieve intelligentization thereof. In addition, the size in the order of microns makes it possible for the MEMS sensor to complete certain functions that cannot be implemented by conventional mechanical sensors. MEMS sensors are widely applied in the fields of automobiles, portable consumer electronic devices, and even medical treatment.

A package of the MEMS sensor is a key factor in design and manufacture of the MEMS sensor, and the package of the MEMS sensor has special requirements, for example, the sensor needs to sense the change in an external environment and implement a function of leading out an electrical signal. Therefore, a path directly connected to the outside is required to be reserved on a housing of the sensor for sensing physical information such as light, heat, an atmospheric pressure, and forces. A typical instance is that: for an MEMS pressure sensor, an opening is required to be arranged on a housing thereof for sensing external medium pressure. The conventional MEMS package comprises: chip package, element package, and system in package. However, for current market demands, more elements and functions are required to be integrated into an increasingly small space. It is difficult for existing package solutions to meet requirements for a device with a higher component density.

SUMMARY

An objective of the present disclosure is to solve the problem that a sensor is bulky. A package assembly of a sensor according to an embodiment of the present disclosure comprises:

a redistribution layer comprising a first face and a second face opposite to each other;

a first die electrically connected to the first face of the redistribution layer;

a molding compound comprising a third face and a fourth face opposite to each other, wherein the third face of the molding compound is combined with the first face of the redistribution layer, and the molding compound encapsulates the first die on the side of the first face of the redistribution layer; and a sensing element electrically connected to the redistribution layer.

Optionally, the sensor apparatus further comprises a second die and a third die, the second die is electrically connected to the first face of the redistribution layer, and the molding compound encapsulates the second die on the side of the first face of the redistribution layer; and the third die is electrically connected to the second face of the redistribution layer.

Optionally, the package assembly further comprises a through mold via electrical connector, and the through mold via electrical connector penetrates the third face and the fourth face of the molding compound and is connected to the redistribution layer; and the fourth face of the molding compound further comprises a pad, and the redistribution layer is electrically connected to the pad by means of the through mold via electrical connector.

Optionally, the molding compound further comprises a side wall connected to the third face and the fourth face, and the pad extends to an outer surface of the side wall of the molding compound along the fourth face of the molding compound.

Optionally, the package structure further comprises a casing mounted on the second face of the redistribution layer, a first space is formed between the casing and the second face of the redistribution layer, and the sensing element is located in the first space; and the casing is provided with a first air vent for communication between the first space and the outside.

Optionally, the casing is adhered to the second face of the redistribution layer.

Optionally, the package assembly further comprises a gelatinous filler, and the gelatinous filler at least partially fills the first space; and the gelatinous filler covers the sensing element.

Optionally, a second space airtightly isolated from the first space is formed between the sensing element and the second face of the redistribution layer; the redistribution layer comprises a second air vent that penetrates the first face and the second face of the redistribution layer; and the molding compound comprises a third air vent that penetrates the third face and the fourth face of the molding compound, the second air vent is in communication with the third air vent, and the second space is in communication with the outside through the second air vent and the third air vent.

Optionally, the sensing element is an MEMS pressure sensing element; and the first die is an ASIC.

According to another aspect of the present disclosure, a sensor is provided, and the sensor comprises a package assembly of a sensor and a carrier substrate, and the package assembly of the sensor is mounted on the carrier substrate.

It can be learned from the above that, for the package assembly of the sensor in the present disclosure, by arranging a redistribution layer and a molding compound, more elements are allowed to be packaged together, and a better structural support is provided and/or a better heat distribution is provided for the package assembly. In addition, the volume and costs of the entire package assembly are reduced.

BRIEF DESCRIPTION OF THE DRAWINGS

The features, characteristics, advantages, and benefits of the present disclosure will become apparent through the detailed description below in conjunction with the accompanying drawings.

DETAILED DESCRIPTION

Embodiments of the present disclosure are described in detail below in conjunction with the accompanying drawings.

Figure 1:
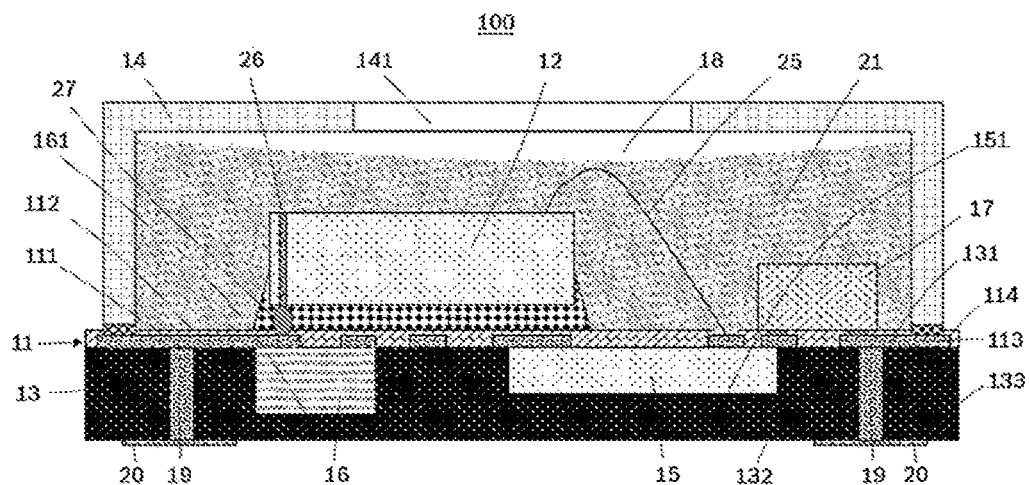
FIG. 1 shows a schematic cross-sectional structural diagram of a package assembly of a sensor according to one embodiment of the present disclosure.

FIG. 1 shows a cross-sectional structure of a package assembly 100 of a sensor according to one embodiment of the present disclosure. As shown in the figure, the package assembly 100 of the sensor comprises a redistribution layer (RDL) 11, a sensing element 12, a molding compound 13, a casing 14, and a first die 15. Optionally, the package assembly of the sensor further comprises a second die 16 and a third die 17. The RDL 11 comprises a first face 111 and a second face 112 opposite to each other, and the first die 15 and the second die 16 are electrically connected to the first face 111 of the RDL 11, and the third die 17 is electrically connected to the second face 112 of the RDL 11. The molding compound 13 encapsulates the first die 15 and the second die 16 on the side of the first face 111 of the RDL 11. The molding compound 13 comprises a third face 131 and a fourth face 132 opposite to each other. When the molding compound 13 encapsulates the first die 15 and the second die 16 on the side of the first face 111 of the RDL 11, the third face 131 of the molding compound 13 is combined with the first face 111 of the RDL 11. In addition, the molding compound 13 can further comprise several conductive columns 19, and the several conductive columns 19 extend from the first face 111 towards the second face 112 of the RDL 11 and penetrate the molding compound 13. The casing 14 is mounted on the second face 112 of the RDL 11, and a first space 18 is formed between the casing 14 and the second face 112 of the RDL 11. The casing 14 is provided with a first air vent 141 for communication between the first space 18 and the outside; and the sensing element 12 is located in the first space 18 and is electrically connected to the second face 112 of the RDL 11.

The RDL 11 comprises a re-configuration line 113 and a medium layer 114, and there may be one or more re-configuration lines 113. In this embodiment, the RDL 11 comprises an embedded re-configuration line 113. The re-configuration line may be formed, for example, in the following manner: the re-configuration line 113 is generated by first forming a seed crystal layer and then forming a metal (such as copper) pattern. Optionally, the re-configuration line 113 may also be formed by a deposition (such as sputtering and plating) and etching process. The material of the re-configuration line 113 may include, but is not limited to a metal material such as copper, titanium, nickel, gold, and a combination thereof, or an alloy thereof. The metal pattern of the re-configuration line 113 is then embedded into the medium layer 114. The medium layer 114 can be any appropriate medium material such as an oxide or a polymer (such as polyimide). An exposed portion of the re-configuration line 113 can be used for electrical connections to different dies. The RDL 11 may be formed by a layer-by-layer process and may be formed by using a thin film technique. In this embodiment, the RDL 11 has a thickness thinner than that of a conventional organic or laminated substrate. For example, a conventional six-layer organic or laminated substrate has a thickness of 300 μm to 500 μm.

The thickness of the RDL 11 can be determined based on the number of re-configuration lines 113 and medium layers 114, and a formation manner. In this embodiment, the re-configuration line 113 has a thickness of 3 μm to 10 μm, and the medium layer 114 has a thickness of 2 μm to 5 μm. The RDL 11 in this embodiment is further allowed to achieve a narrower line spacing width (fine spacing) and a finer line than that of the conventional organic or laminated substrate. In this embodiment, the RDL 11 has a total thickness of less than 50 μm, for example, 25 μm to 30 μm, or less, for example, 20 μm. In this embodiment, the first face 111 of the RDL 11 is formed by the medium layer 114 for achieving passivation of the RDL 11.

Referring to FIG. 1, the sensing element 12, the first die 15, the second die 16, and the third die 17 are electrically connected to the RDL 11. The type of the first die 15 may depend on a specific application. For example, the first die 15 can be a logical component (such as an ASIC), a memory, or other components, and different types of first dies 15 can be electrically connected to the RDL 11. The second die 16 and the third die 17 can be passive components such as capacitors or inductors. In this embodiment, the first die 15 and the second die 16 are electrically connected to the first face 111 of the RDL 11 for being connected to the re-configuration line 113, so as to be electrically connected to the RDL 11. The sensing element 12 and the third die 17 are electrically connected to the second face 112 of the RDL 11.

The electrical connection can be achieved by using a plurality of techniques. For example, the first die 15 and the second die 16 may be achieved by using a flip chip method. Specifically, the first die 15 and the second die 16 each comprise a side face with a contact pad (not shown in the figure) and another opposite side face without a contact pad. The side face with a contact pad can further comprise a passivation layer surrounding the contact pad. Side faces with contact pads of the first die 15 and the second die 16 are electrically connected to the first face 111 of the RDL 11. Further, the contact pads of the first die 15 and the second die 16 are electrically connected to the exposed portion of the re-configuration line of the RDL 11 with a conductive bump such as a welding material. In addition, a conductive bump and a non-conductive paste (NCP) or a non-conductive film (NCF) laterally surrounding the conductive bump may be used to electrically connect the third die 17 to the second face 112 of the RDL 11, and the electrical connection can be achieved by electrically connecting the conductive bump to the exposed portion of the re-configuration line of the RDL 11 from the second face 112 by means of heat compression. The conductive bump is formed of, for example, gold or a solder material.

Then, the first die 15 and the second die 16 can be encapsulated by using the molding compound 13. The molding compound 13 consists of, for example, a thermosetting crosslinked resin (such as epoxy resin), liquid or granule, and a sheet or a film. The first die 15 and the second die 16 can be encapsulated by using appropriate techniques, for example, compression molding, liquid encapsulant injection, and lamination. In this embodiment, the molding compound 13 is a layer with continuous and uniform composition that is filled on the side of the first face 111 of the RDL 11 and that encapsulates the first die 15 and the second die 16. As shown in FIG. 1, the molding compound 13 comprises the third face 131 and the fourth face 132 opposite to each other. When the molding compound 13 encapsulates the first die 15 and the second die 16 on the first face 111 of the RDL 11, the third face 131 of the molding compound 13 is in contact with the first face 111 of the RDL 11, and lateral sides of the first die 15 and the second die 16 are enclosed in the molding compound 13. In addition, the molding compound 13 is also formed on front surfaces 151 and 161 of the first die 15 and the second die 16, which are far away from the first face 111 of the RDL 11. Those skilled in the art should understand that not all of the front surfaces of the first die 15 and the second die 16 are required to be enclosed in the molding compound 13. For example, in some other embodiments, the lateral sides of the first die 15 and the second die 16 are enclosed in the molding compound 13, but no molding compound is formed on the front surfaces of the first die 15 and the second die 16, that is, the front surfaces of the first die 15 and the second die 16 are exposed.

The molding compound 13 comprises at least one conductive column 19. In this embodiment, the conductive column 19 is a through mold via (TMV) electrical connector, and the TMV electrical connector penetrates the third face 131 and the fourth face 132 of the molding compound 13 and is connected to the first face 111 of the RDL 11. Specifically, the TMV electrical connector is connected to a single re-configuration line or a plurality of re-configuration lines of the RDL 11 to achieve electrical connection to the RDL 11. The TMV electrical connector can be formed on the molding compound 13 in any appropriate manner, including formation by drilling such as laser drilling. Alternatively, a columnar structure may be prearranged in a process of forming the molding compound 13, so as to form the TMV electrical connector in a demolding process. The TMV electrical connector can be cleaned for subsequent processing after being formed. The cleaning may include any appropriate operation, for example, wet etching, plasma etching, or a combination thereof. The number of TMV electrical connectors is determined based on the number of input/output (I/O) elements comprised on the RDL 11. By arranging an TMV electrical connector, outputting a signal of the package assembly 100 of the sensor to other circuits such as a PCB board serving as a carrier substrate of the sensor can be achieved. As shown in the figure, a conductive filler is added to the TMV electrical connector, and the filler is a conductive plugging material or a metal such as copper. Filling can be implemented by any appropriate operation to ensure a proper electrical connection between the filler and the RDL 11. A pad 20 is further arranged on a part of the TMV electrical connector on the fourth face 132 of the molding compound 13. The TMV electrical connector is connected to the pad 20.

The casing 14 is mounted on the second face 112 of the RDL 11, and in this embodiment, the casing 14 is adhered to the second face 112 of the RDL 11 by means of an adhesive. A conductive adhesive may be used to achieve good electromagnetic interference (EMI) shielding. The casing 14 is mounted on the second face 112 of the RDL 11, and the first space 18 is formed between the casing 14 and the second face 112 of the RDL 11. The sensing element 12 is located in the first space 18 and is electrically connected to the second face 112 of the RDL 11. The casing 14 further comprises the first air vent 141 for communication between the first space 18 and the outside.

A plurality of electrical connection techniques, for example, lead bonding 25, a flip chip method 27, or a through silicon via (TSV) electrical connector 26 in FIG. 1 may be used to electrically connect the sensing element 12 to the second face 112 of the RDL 11, so as to achieve the electrical connection between the sensing element 12 and the RDL 11.

In the package assembly 100 of the sensor in this embodiment, the sensing element 12 is an MEMS fluid pressure sensing element for measuring pressure of an external medium such as air or liquid. The first die 15 is an ASIC, the ASIC comprises one or more circuits embedded in and/or on a substrate such as silicon, gallium arsenide, silicon carbide (SiC) graphene, or any semiconductor material, and the ASIC is configured to perform a specific task or implement a specific function. Specifically, the external medium enters the first space 18 through the first air vent 141 for communication between the first space 18 and external space, and the sensing element 12 senses the pressure of the external medium. Moreover, the first die 15, the second die 16, and the third die 17 that are electrically connected to the RDL 11 for being electrically connected to the sensing element 12 convert the pressure of the external medium that is sensed by the sensing element 12 into an electrical signal, and output the electrical signal via the TMV electrical connector 19.

In addition, a protection member such as a gelatinous filler 21 may be further used to protect the sensing element 12, so as to protect normal working of the sensing element 12 in a harsh working environment. The gelatinous filler 21 at least partially fills the first space 18 and covers the sensing element 12. Further, the gelatinous filler may also cover the second face 112 of the RDL 11, and even cover the third die 17 that is electrically connected to the second face 112 of the RDL 11. The gelatinous filler 21 has an electrical insulation property, and the gelatinous filler 21 is used to prevent the sensing element 12 and the third die 17 from being affected by introduced media contaminants. The gelatinous filler 21 is more likely to be of a colloidal material in a solid form than solution, and the gelatinous filler 21 can isolate the fluid pressure sensing element 12 from the harsh surrounding environment and can at the same time accurately deliver, to the sensing element 12, pressure that is applied by the external medium.

Figure 2:
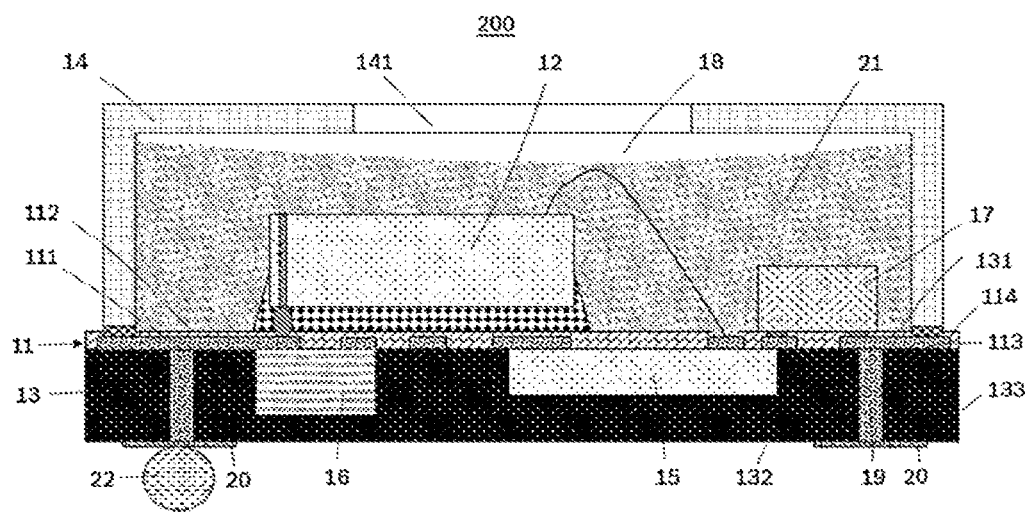
FIG. 2 shows a schematic cross-sectional structural diagram of a package assembly of a sensor according to another embodiment of the present disclosure.

FIG. 2 shows a cross-sectional structure of a package assembly 200 of a sensor according to a second embodiment of the present disclosure. Compared with FIG. 1, in the package assembly 200 of the sensor in FIG. 2, after a molding compound 13 is formed, a conductive bump 22 may be attached to the molding compound 13 or is directly formed on the molding compound 13. As shown in the figure, the conductive bump 22 is arranged on a part of a through mold via electrical connector 19 on a fourth face 132 of the molding compound 13. The conductive bump 22 can be of a plurality of structures, such as a solder ball, or a plated pile shown in FIG. 2. The conductive bump 22 is configured to electrically connect the package assembly of the sensor to other circuits such as a carrier substrate.

Figure 3:
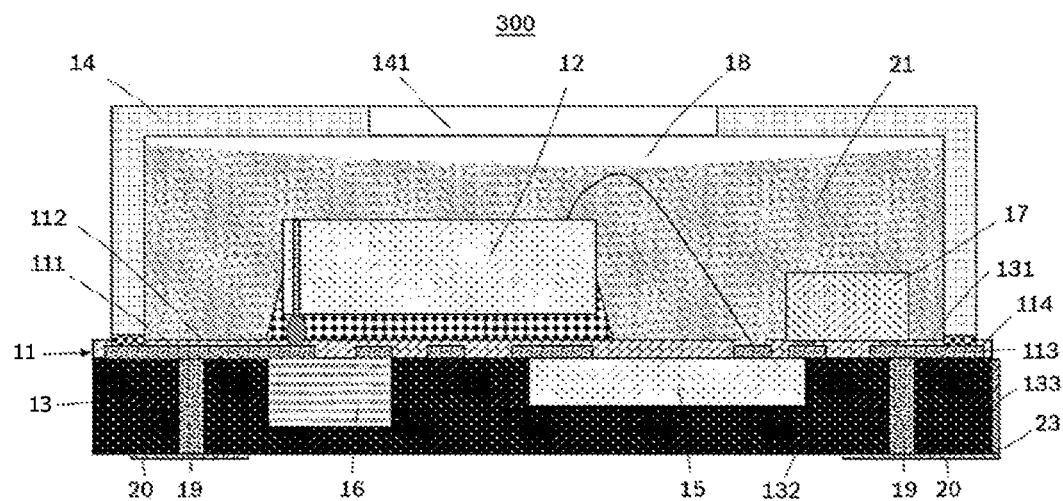
FIG. 3 shows a schematic cross-sectional structural diagram of a package assembly of a sensor according to still another embodiment of the present disclosure.

FIG. 3 shows a cross-sectional structure of a package assembly 300 of a sensor according to a third embodiment of the present disclosure. Compared with FIG. 1, the package assembly 300 of the sensor in FIG. 3 further has a pad 20 on a part of a TMV electrical connector 19 on a fourth face 132 of a molding compound 13, and the pad 20 extends to an outer surface of a side wall 133 of the molding compound 13 along a fourth face 132 of the molding compound 13, and forms, in a transition region between the outer surfaces of the fourth surface 132 and the sidewall 133, a solder paste floating channel 23 that can be clearly seen in automated optical inspection (AOI).

Figure 4:
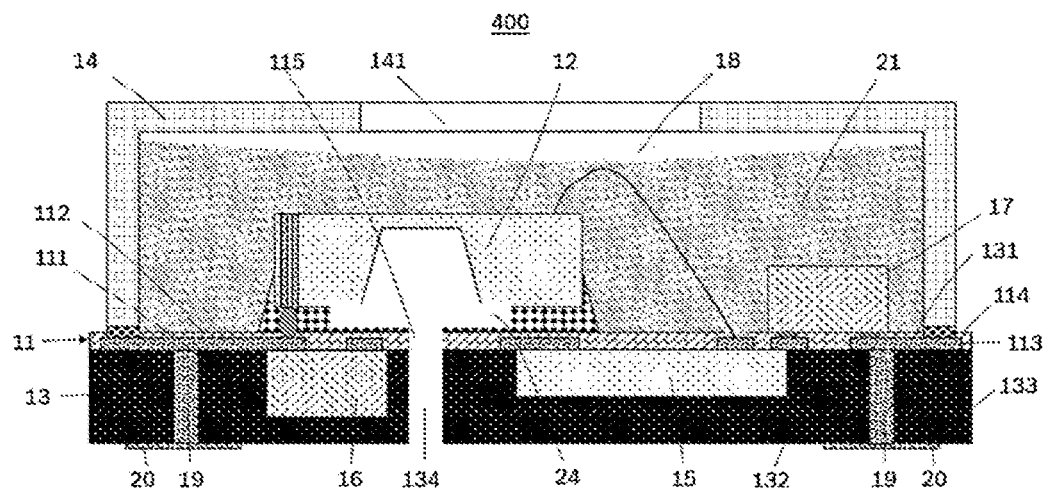
FIG. 4 shows a schematic cross-sectional structural diagram of a package assembly of a sensor according to yet another embodiment of the present disclosure.

FIG. 4 shows a cross-sectional structure of a package assembly 400 of a sensor according to a fourth embodiment of the present disclosure. In this embodiment, a sensing element 12 is mounted on a second face 112 of an RDL 11, and a second space 24 that is airtightly isolated from the first space 18 is formed on one side of the sensing element that is opposite to the second face 112 of the redistribution layer.

The RDL 11 is provided with a second air vent 115 for communication between a first face 111 and the second face 112 of the RDL 11, and a molding compound 13 is provided with a third air vent 134 for communication between a third face 131 and a fourth face 132 of the molding compound 13, and the second air vent 115 is in communication with the third air vent 134. In addition, the second air vent 115 and the third air vent 134 are in communication with the second space 24 and an external medium. The sensing element 12 in this embodiment may be further used to measure pressure of the external medium in the second space 24. Further, pressure of an external medium in the first space 18 also can be compared with the pressure of the external medium in the second space 24 by cooperation with a first die 15 that is arranged on the first face 111 of the RDL 11. For example, a difference between the pressure of the external medium in the first space 18 and the pressure of the external medium in the second space 24 is obtained by comparison.

Arrangement of an RDL and a molding compound can increase an expansion area of a package assembly of a sensor, thereby allowing more assemblies to be packaged together and providing a better structural support or providing a better heat dissipation for the package assembly. In addition, coupling of the RDL and the molding compound further achieves a package form of a system in package (SIP). The SIP structure uses the RDL to fan out an electrical terminal of a die and allows a passive element and/or a casing to be packaged together, thereby reducing use of an organic substrate, etc., and reducing the volume of the entire package assembly. In addition, the package assembly is protected, and the package assembly of the sensor is allowed to contact with the outside.

Next-level package can be further performed on the package assembly of the sensor in the present disclosure and other circuits such as a carrier substrate, to form, for example, an MEMS pressure/pressure difference sensor.

For those skilled in the art, a variety of corresponding modifications and variations can be made according to the above technical solutions and concepts, and all the modifications and variations shall fall within the protection scope of the claims of the present disclosure.

The invention claimed is:

1. A package assembly of a sensor, comprising:
   a redistribution layer comprising a first face and a second face opposite to each other;
   a first die electrically connected to the first face of the redistribution layer;
   a molding compound comprising a third face and a fourth face on opposite sides of the molding compound from each other, wherein the third face of the molding compound is combined with the first face of the redistribution layer such that the third face of the molding compound and the first face of the redistribution layer contact one another, and the molding compound encapsulates the first die on the side of the first face of the redistribution layer; and
   a sensing element electrically connected to the redistribution layer; and
   a casing mounted on the second face of the redistribution layer in such a way that a first space is formed between the casing and the second face of the redistribution layer,
   wherein the sensing element is located in the first space, and
   wherein the casing defines a first air vent for communication between the first space and an exterior of the package assembly.

2. The package assembly according to claim 1, further comprising:
   a second die; and
   a third die,
   wherein the second die is electrically connected to the first face of the redistribution layer,
   wherein the molding compound encapsulates the second die on the side of the first face of the redistribution layer, and
   wherein the third die is electrically connected to the second face of the redistribution layer.

3. The package assembly according to claim 1, further comprising:
   a through mold via electrical connector, the through mold via electrical connector penetrates the third face and the fourth face of the molding compound and is connected to the redistribution layer,
   wherein the fourth face of the molding compound further comprises a pad, and the redistribution layer is electrically connected to the pad by way of the through mold via electrical connector.

4. The package assembly according to claim 3, wherein the molding compound further comprises a side wall connected to the third face and the fourth face, and the pad extends to an outer surface of the side wall of the molding compound along the fourth face of the molding compound.

5. The package assembly according to claim 1, wherein the casing is adhered to the second face of the redistribution layer.

6. The package assembly according to claim 1, further comprising a gelatinous filler that at least partially fills the first space and covers the sensing element.

7. The package assembly according to claim 1, wherein a second space airtightly isolated from the first space is formed between the sensing element and the second face of the redistribution layer; the redistribution layer comprises a second air vent that penetrates the first face and the second face of the redistribution layer; and the molding compound comprises a third air vent that penetrates the third face and the fourth face of the molding compound, the second air vent is in communication with the third air vent, and the second space is in communication with the outside through the second air vent and the third air vent.

8. The package assembly according to claim 1, wherein the sensing element is an MEMS pressure sensing element; and the first die is an ASIC.

9. A micro electro-mechanical system sensor, comprising the package assembly according to claim 1, and a carrier substrate, wherein the package assembly of the sensor is mounted on the carrier substrate.

10. The package assembly according to claim 6, wherein the gelatinous filler is on an opposite side of the redistribution layer from the molding compound.

11. The package assembly according to claim 6, wherein the gelatinous filler is in contact with the second face of the redistribution layer.

12. The package assembly according to claim 6, further comprising:
   a second die connected to the first face of the redistribution layer and encapsulated by the molding compound.

13. The package assembly according to claim 12, further comprising:
   a third die arranged in the first space and mounted to the second face of the redistribution layer, the third die being covered by the gelatinous filler.

14. The package assembly according to claim 6, wherein:
   a second air vent is defined in the redistribution layer;

a third air vent is defined in the molding compound;

the second and third air vents are aligned with one another and connect the exterior of the package assembly to a second space that is adjacent to the sensing element and airtightly isolated from the first space.

15. The package assembly according to claim 6, wherein the casing is connected to the second face of the redistribution layer by an adhesive.

\* \* \* \* \*